United States Patent
Yamaichi

(10) Patent No.: US 9,019,584 B2
(45) Date of Patent: Apr. 28, 2015

(54) HOLOGRAPHIC IMAGE REPRODUCTION MECHANISM USING ULTRAVIOLET LIGHT

(75) Inventor: Eiji Yamaichi, Shinagawa-ku (JP)

(73) Assignee: Empire Technology Development LLC, Wilmington, DE (US)

( * ) Notice: Subject to any disclaimer, the term of this patent is extended or adjusted under 35 U.S.C. 154(b) by 233 days.

(21) Appl. No.: 13/577,508

(22) PCT Filed: Mar. 12, 2012

(86) PCT No.: PCT/JP2012/001703
§ 371 (c)(1),
(2), (4) Date: Aug. 7, 2012

(87) PCT Pub. No.: WO2013/136358
PCT Pub. Date: Sep. 19, 2013

(65) Prior Publication Data
US 2013/0235439 A1    Sep. 12, 2013

(51) Int. Cl.
*G03H 1/08* (2006.01)
*G02B 5/32* (2006.01)

(52) U.S. Cl.
CPC ........................................ *G02B 5/32* (2013.01)

(58) Field of Classification Search
CPC ........ G02B 5/32; G02B 5/0252; G02B 5/203; G01B 9/02; G01J 11/00; G01J 9/02
See application file for complete search history.

(56) References Cited

U.S. PATENT DOCUMENTS

| | | | |
|---|---|---|---|
| 3,544,711 A | 12/1970 | DeBitetto | |
| 4,572,618 A * | 2/1986 | Abraham et al. | 359/241 |
| 7,914,154 B2 | 3/2011 | Obi et al. | |
| 2003/0224219 A1* | 12/2003 | Nakazawa et al. | 428/701 |
| 2007/0117027 A1* | 5/2007 | Yoshizawa et al. | 430/1 |
| 2007/0211319 A1 | 9/2007 | Tomida | |
| 2008/0146816 A1* | 6/2008 | Fabre-Francke et al. | 548/335.1 |
| 2011/0157667 A1 | 6/2011 | Lacoste et al. | |

FOREIGN PATENT DOCUMENTS

| | | |
|---|---|---|
| CN | 101034279 A | 9/2007 |
| JP | 01-219783 | 9/1989 |
| JP | 05-165392 | 7/1993 |
| JP | 07-015751 | 1/1995 |

(Continued)

OTHER PUBLICATIONS

International Search Report and Written Opinion for PCT/JP2012/001703 dated May 1, 2012.

(Continued)

*Primary Examiner* — Jennifer L. Doak
(74) *Attorney, Agent, or Firm* — Pepper Hamilton LLP

(57) ABSTRACT

A holographic image display system comprises a screen, a first and a second light source, a scanning mechanism, and a controller. The screen includes a photochromic material arranged thereon. The photochromic material has light absorption characteristics which change depending on illumination with a wavelength of an ultraviolet light beam. The first light source directs a visible light beam with a sufficiently large diameter onto the screen, whereas the second light source directs an ultraviolet light beam onto the screen through the scanning mechanism. The controller controls emissions and scanning of the ultraviolet light beam based on a holographic signal so that the ultraviolet light beam can be scanned across the screen.

22 Claims, 9 Drawing Sheets

(56) References Cited

FOREIGN PATENT DOCUMENTS

| | | |
|---|---|---|
| JP | 09-327040 | 12/1997 |
| JP | 2008077044 A | 4/2008 |
| JP | 2011243817 A | 12/2011 |
| TW | 200827771 A | 7/2008 |
| TW | 200841042 A | 10/2008 |

OTHER PUBLICATIONS

Akishige et al., Identification of Photochromic Absorption in $KTaO_3$ Doped with Ni and Fe, *Japanese J. Appl. Phys.* (1980), 19:1633-1639 (Abstract).

* cited by examiner

HOLOGRAPHIC IMAGE REPRODUCTION MECHANISM USING ULTRAVIOLET LIGHT

CLAIM OF PRIORITY

This application is a U.S. national stage filing under 35 U.S.C. §371 of International Application No. PCT/JP2012/001703 filed Mar. 12, 2012 entitled "Holographic Image Reproduction Mechanism Using Ultraviolet Light," the disclosure of which is incorporated by reference in its entirety.

TECHNICAL FIELD

The present disclosure relates generally to holographic image reproduction mechanisms, and more particularly to a holographic image display system and method using ultraviolet light.

BACKGROUND

Holography is known as a technique that allows a three-dimensional image to be recorded and later reproduced. Specifically, coherent light is split into two light beams by a beam splitter, and then one light beam is directed onto an object and light reflected from the object (i.e., object light) illuminates onto a recorded medium, while the other light beam (i.e., reference light) directly illuminates to the recorded medium. Under this situation, the object light and the reference light interfere with each other, thereby causing interference fringes on the recording medium, and thus the interference fringes are recorded on the recording medium. The interference fringes recorded on the recording medium may be called a "hologram." In a case where reproduction light which is the same as the reference light is illuminated on the recording medium which records the hologram, the reference light is diffracted by the hologram so that the optical wavefront of the reflected light which reaches the recording medium from an original object at the time when recording the hologram can be reproduced, and, as a result of this, images which possess three-dimensional characteristics of the original object can be observed.

In recent years, through the use of holography, holographic image displays for reproducing three-dimensional moving images have been studied. An example of a holographic image display is one which is directed to controlling a spatial modulation device in accordance with a video signal of a hologram derived from an object. It is known that a liquid crystal matrix having the characteristics of high-speed response and high definition can be used as a spatial modulation layer of such a spatial modulation device. Such a matrix allows a hologram (i.e., interference fringes) to be formed on a screen in real-time in accordance with a video signal, and when the hologram on the screen is illuminated with reproduction light, a three-dimensional image of the object can be reproduced.

SUMMARY

In an aspect, the present disclosure sets forth a holographic image display system. The system includes a screen, a first and a second light sources, a scanning mechanism, and a controller. The screen includes a photochromic material arranged thereon. The photochromic material has light absorption characteristics which change depending on illumination with a wavelength of an ultraviolet light beam. The first light source directs a visible light beam with a sufficiently large diameter onto the screen, whereas the second light source directs an ultraviolet light beam onto the screen through the scanning mechanism. The controller controls emissions and scanning of the ultraviolet light beam based on a holographic signal so that the ultraviolet light beam can be scanned across the screen.

In an aspect, a method of reproducing a holographic image is provided. The method includes directing a visible coherent light beam onto a screen including a photochromic material, and directing an ultraviolet light beam onto the screen, while controlling emissions of the ultraviolet light beam and controlling scanning of the ultraviolet light beam across the screen, based on a holographic signal. The photochromic material having light absorption characteristics which change upon illumination with a wavelength of the ultraviolet light beam.

In an aspect, the present disclosure sets forth a method of manufacturing a holographic image display system. The method includes forming a photochromic layer on a surface of a transparent plate so as to obtain a screen. The photochromic layer includes a photochromic material having light absorption characteristics which change depending on illumination with a wavelength of an ultraviolet light beam. The method further includes providing a first light source configured to emit a visible coherent light beam so as to direct the visible coherent light beam onto the screen, providing a second light source configured to emit the ultraviolet light beam so as to apply the ultraviolet light beam to the screen, providing a scanning mechanism on a light path of the ultraviolet light beam so as to allow the ultraviolet light beam to scan across the screen, and providing a controller configured to control emissions of the second light source and scanning of the scanning mechanism, based on a holographic signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
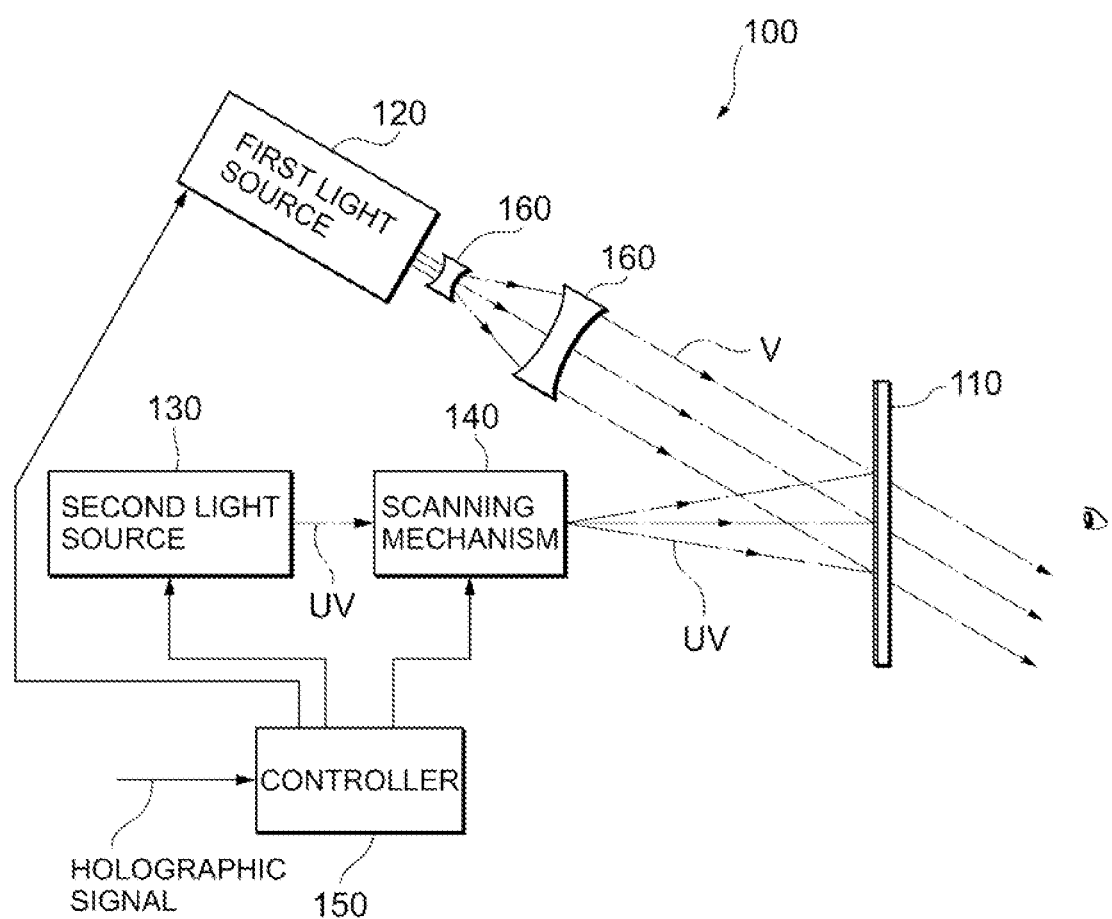
FIG. 1 is a schematic block diagram showing an example of a holographic image display system arranged in accordance with the present disclosure.

In the following detailed description, reference is made to the accompanying drawings, which form a part hereof. In the drawings, similar symbols typically identify similar components, unless context dictates otherwise. Further, the drawings are intended to be explanatory and may not be drawn to scale. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure describes techniques, devices, apparatuses, systems, and methods for reproduction of a three-dimensional image, including, but not limited to, directing a visible coherent light beam onto a screen which includes a photochromic material having light absorption characteristics which change upon illumination with a wavelength of an invisible light beam (i.e., ultraviolet light beam), and directing the ultraviolet light beam onto the screen, while controlling emissions of the ultraviolet light beam and controlling scanning of the ultraviolet light beam across the screen, based on a holographic signal.

The holographic signal is a signal corresponding to a holographic image of an original object or scene. The holographic signal may be obtained by a conventional holographic technique using a television camera. Alternatively, the holographic signal may be a computer-generated signal based on a virtual three-dimensional space.

FIG. 1 is a schematic block diagram showing a non-limiting example of a holographic image display system arranged in accordance with the present disclosure. Referring to FIG. 1, the holographic image display system 100 may include a screen 110, a first light source 120, second light source 130, a scanning mechanism 140, and a controller 150. The holographic image display system 100 may also include one or more optical elements 160. During operation of the holographic image display system 100, an observer looks into the screen 110 to see a holographic image on his/her retina of what he/she would have seen when looking at an original object.

Figure 3:
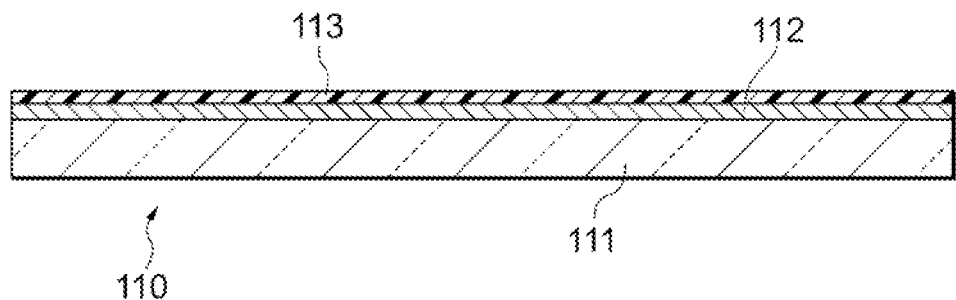
FIG. 3 is a cross-sectional view showing a screen of a holographic image display system arranged in accordance with the present disclosure.

The screen 110 may include a plate 111, being transparent, and a photochromic layer 112 arranged on a surface of the plate 111 (see FIG. 3). The photochromic layer 112 may be made of a photochromic material. The photochromic material may have light absorption characteristics which change depending on illumination with a wavelength of an ultraviolet light beam. For example, potassium tantalate ($KTaO_3$) doped with nickel (Ni) (Ni-doped $KTaO_3$) is known as a photochromic material. An organic photochromic material may be used.

The screen 110 may be formed in any shape, such as, but not limited to, a square, rectangular, circle, or ellipse. Further, the screen 110 may include a curved surface at a constant radius of curvature. A size of the screen 110 may also be in any size. In a non-limiting example, a size of the screen 110 may be adapted for mobile phones up to huge displays. A specific example of the size and shape of the screen 110 is a rectangle, about 50 centimeters in height and about 60 centimeters in width.

The first light source 120 may be a laser which emits, under control of the controller 150, a visible coherent light beam V that is applied to the screen 110. Namely, the visible coherent light beam V is used as reproduction light in the holography. As one non-limiting example, the first light source 120 may be a helium-neon (He—Ne) laser. As another non-limiting example, the first light source 120 may be an argon (Ar) laser. Otherwise, a laser diode such as an aluminum gallium indium phosphide-based (AlGaInP-based) laser or a gallium nitride-based (GaN-based) laser may be applicable. In order to obtain a large diameter of the visible coherent light beam V, the optical elements 160, including, but not limited to, collimators or diverging lenses, may be arranged in the path of the visible coherent light beam V.

The second light source 130 may be a laser which emits, under control of the controller 150, an ultraviolet light beam UV that is applied to the screen 110. As one non-limiting example, the second light source 130 may emit the ultraviolet light beam UV in pulses. It should be noted that the ultraviolet light beam UV is used to form interference fringes on the screen 110, and, in combination with the reproduction light (i.e., visible coherent light beam V), an optical wavefront can be formed, accordingly. An optical axis of the ultraviolet light beam UV is set at a predetermined angle with an optical axis of the visible light beam. In this example, the second light source 130 may be a helium-cadmium (He—Cd) laser. As one non-limiting example, an oscillation wavelength of the He—Cd laser may be 325 nm, and its output power may be 150 mW. Another type of laser capable of emitting an ultraviolet light beam may be applicable. The type of laser used for the second light source 130 may be determined depending on the light absorption characteristics of the photochromic layer 112. The ultraviolet light beam UV emitted from the second light source 130 may be directed to the scanning mechanism 140.

The scanning mechanism 140 may be configured to allow the ultraviolet light beam UV to scan across the screen 110 under control of the controller 150. The scanning mechanism 140 may be, but is not limited to being, a horizontal scanning mirror which controls a horizontal illumination position of the ultraviolet light beam UV, and a vertical scanning mirror which controls a vertical illumination position of the ultraviolet light beam UV. Alternatively, a scanning mirror may be adapted to have a swaying motion in X-Y directions (see also FIG. 10).

The controller 150 may be configured to control the intensity of emissions of the second light source and also control the scanning of the scanning mechanism 140 based on a holographic signal. Specifically, in operation, the controller 150 may receive the holographic signal from, for example, a receiver (not shown). The holographic signal may be transmitted through, for example, a wired or wireless communication network, including, but not limited to, a LAN, a WAN, the Internet, terrestrial broadcasting, a cable network, or a satellite channel. The controller 150 may generate a synchronization signal and then may provide the holographic signal together with the synchronization signal to the second light source 130. The controller 150 may also provide the synchronization signal to the scanning mechanism 140. Accordingly, the second light source 130 may emit the ultraviolet light beam UV in pulses in accordance with the holographic signal and the synchronization signal. In the meantime, the scanning mechanism 140 may conduct scanning in accordance with the synchronization signal. An example of the configuration of the controller 150 will be discussed with reference to FIG. 9.

Figure 2:
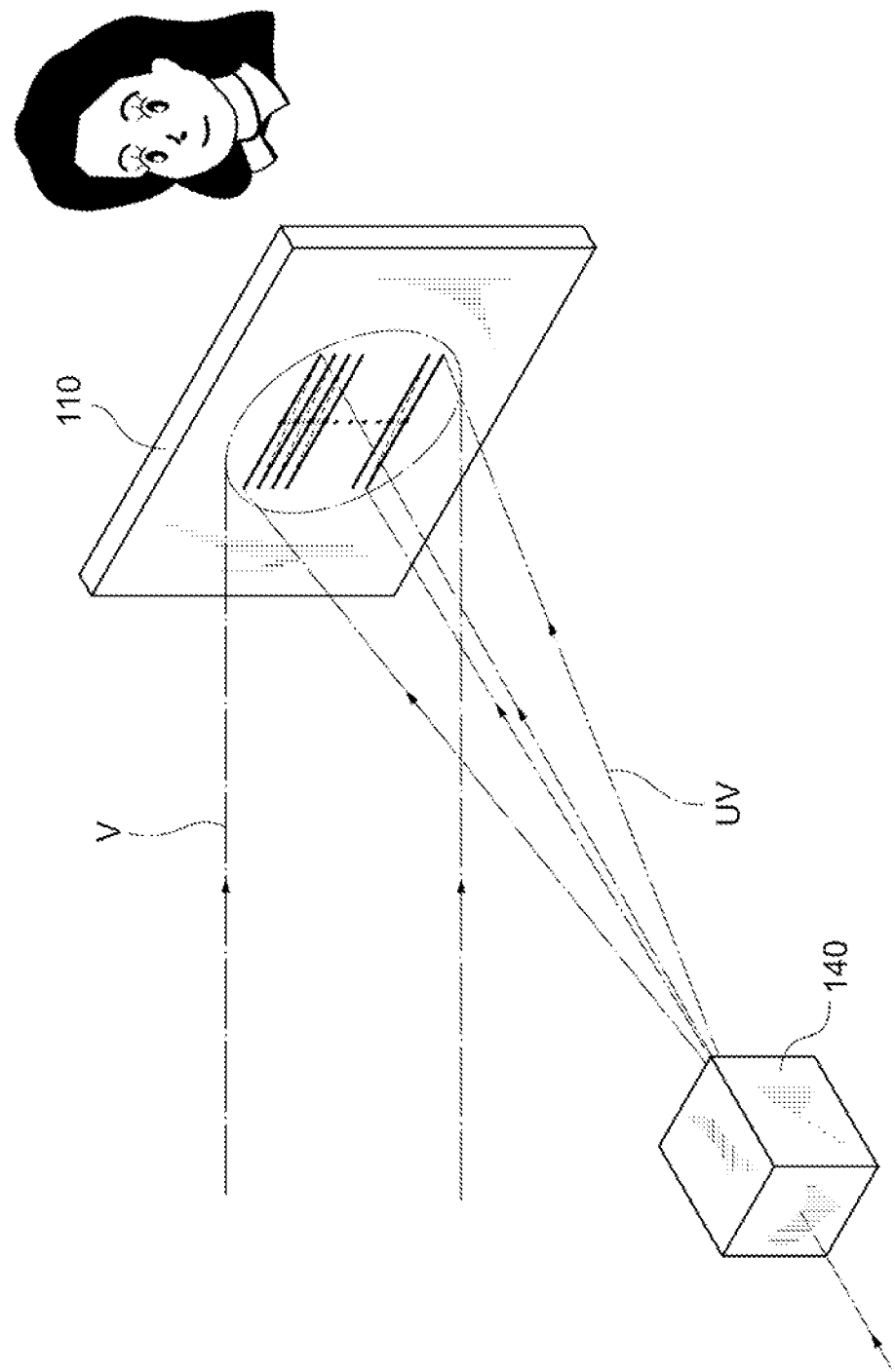
FIG. 2 is a schematic perspective view showing scanning by a scanning mechanism of a holographic image display system arranged in accordance with the present disclosure.

FIG. 2 is a schematic perspective view showing scanning by a scanning mechanism of a holographic image display system arranged in accordance with the present disclosure. As shown in FIG. 2, the ultraviolet light beam UV may be applied onto the screen 110 in a raster scanning manner by the scanning mechanism 140. The raster scanning may form a substantially-rectangular pattern, which is composed of scanlines, within a range of the visible coherent light beam V on the screen 110. Each of the scanlines may be divided into discrete pixels corresponding to the intensity of each of the pulses of the ultraviolet light beam UV emitted from the second light source 130 under control of the controller 150.

FIG. 3 is a cross-sectional view showing a screen of a holographic image display system arranged in accordance with the present disclosure. As shown in FIG. 3, the screen 110 may include the plate 111 and a photochromic layer 112 arranged on a surface 111a of the plate 111. In some embodiments, a protective layer 113 may be arranged on the photochromic layer 112.

As one non-limiting example, the plate 111 may be made of transparent glass such as silicon dioxide or silica, or transparent plastic such as a fluorinated polymer or polycarbonate, but is not limited to being made of such glass or plastic. The plate 111 may be formed to include a curved surface at a constant radius of curvature. A non-limiting example of a thickness of the plate 111 may be greater than several micrometres and several millimetres or less. A non-limiting example of a thickness of the plate 111 may be greater than 0.4 millimetres and about 1 millimetre or less. Specific examples of the thickness are about 0.4 millimetres about 0.5 millimetres, about 0.6 millimetres, about 0.7 millimetres, about 8 millimetres, about 9 millimetres, and about 10 millimetres, and ranges between any two of these values. Alternatively, a thickness of the plate 111 of 10 millimetres or more may be applicable.

As mentioned above, the photochromic layer 112 may be made of a photochromic material having light absorption characteristics which change depending on illumination with a wavelength of the ultraviolet light beam UV emitted from the second light source 130. The light absorption characteristics may be referred to as a light absorption coefficient. As one non-limiting example, the photochromic layer 112 may be made of Ni-doped $KTaO_3$. The light absorption characteristics may be explained by stating that electrons excited by energy of the ultraviolet light beam UV may be trapped in complex defects formed by doped Ni and oxygen vacancies (VO). In other words, Ni ions (Ni3+) having VO at the center thereof (Ni3+-VO) form complex defects (Ni3+-VO), so that each of the complex defects (Ni3+-VO) may trap either one or two electrons, thereby resulting in (Ni3+-VO-e) or (Ni3+-VO-2e). The complex defects (Ni3+-VO) trapping an electron or electrons may indicates characteristics capable of absorbing a sufficiently wide range of a wavelength of visible light. Among other, the complex defects trapping two electrons (Ni3+-VO-2e) may have a light absorption peak at a wavelength of 630 nm as well as a wide absorption band. The wavelength of 630 nm is covered within the range of a wavelength of visible light. Further, an example of a power of the ultraviolet light beam UV may correspond to an electronic energy level of no less than about 3.1 eV. Thus, the photochromic material may be selected to have a band gap greater than about 3 eV. A band gap of Ni-doped $KTaO_3$ may be about 3.5 eV. In this case, an ultraviolet light beam UV with an electronic energy level of greater than about 3.5 eV. may be selected.

The light absorption coefficient of the photochromic layer 112 may be relatively lower in an initial state, so that the photochromic layer 112 may allow the visible coherent light beam V to pass through the screen 110. When the ultraviolet light beam UV having a specific wavelength and energy is illuminated on a portion of the photochromic layer 112, the light absorption coefficient of the portion of the photochromic layer 112 may increase, so that the portion of the photochromic layer 112 may absorb the visible coherent light beam V. As a result of this, the visible coherent light beam V illuminating the portion cannot pass through the screen 110. Further, when the illumination of the ultraviolet light beam UV is removed, the light absorption coefficient may be restored to the initial state.

As one non-limiting example, the photochromic layer 112 may be made of at least one of, but not limited to, $KTaO_3$, $SrTiO_3$, and $BaTiO_3$, doped with at least one of, but not limited to, Fe, Ni, Co, Cr, and V. Alternatively, the photochromic layer 112 may be made of an organic photochromic material. As one non-limiting example, the photochromic layer 112 being organic may be made of hexaarylbiimidazole (HABI). A non-limiting example of a thickness of the photochromic layer 112 may be greater than one micrometre and about 10 micrometres or less. Specific examples of the thickness are about 3 micrometres, about 4 micrometres, about 5 micrometres, about 6 micrometres, about 7 micrometres, about 8 micrometres, about 9 micrometres, and about 10 micrometres, and ranges between any two of these values. Alternatively, a thickness of the photochromic layer 112 of 10 micrometres or more may be applicable.

Although not shown in FIG. 3, the screen 110 may include an ultraviolet protection layer arranged thereon. Specifically, the ultraviolet protection layer may be arranged on an opposite surface of the screen 110 to the protective layer 113. The ultraviolet protection layer may prevent the transmission of ultraviolet light therethrough. Thus, the ultraviolet protection layer may be used to protect an observer's retinas from the ultraviolet light beam UV being passed through the screen 110.

Figure 4:
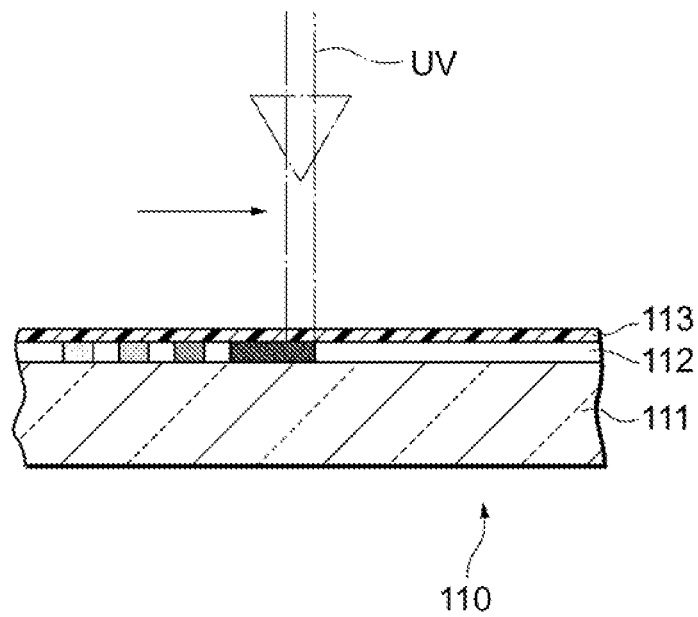
FIG. 4 is a schematic, partial cross-sectional view showing a screen of a hologram image display system arranged in accordance with the present disclosure.

FIG. 4 is a schematic, partial cross-sectional view showing a screen of a hologram image display system arranged in accordance with the present disclosure. More specifically, FIG. 4 illustrates change in the light absorption coefficient of the photochromic layer 112 as it would appear when the ultraviolet light beam UV is illuminated.

In FIG. 4, it is assumed that the ultraviolet light beam UV sweeps horizontally left-to-right across the screen 110 at a steady scanning rate. The ultraviolet light beam UV may be emitted in pulses and scanned in accordance with the holographic signal and the synchronization signal under control of the controller 150. When the ultraviolet light beam UV is illuminated on a portion of the photochromic layer 112 of the screen 110, the light absorption coefficient of the portion of the photochromic layer 112 may increase from an initial state, thereby highly absorbing the visible coherent light beam V. Once the ultraviolet light beam UV has swept forward, the light absorption coefficient of the portion of the photochromic layer 112 may decrease to the initial state after a predetermined period of time. Accordingly, by the raster scanning, portions where the ultraviolet light beam UV is not illuminated may form slits for interference fringes (i.e., a diffraction grating) on the screen 110.

Figure 5:
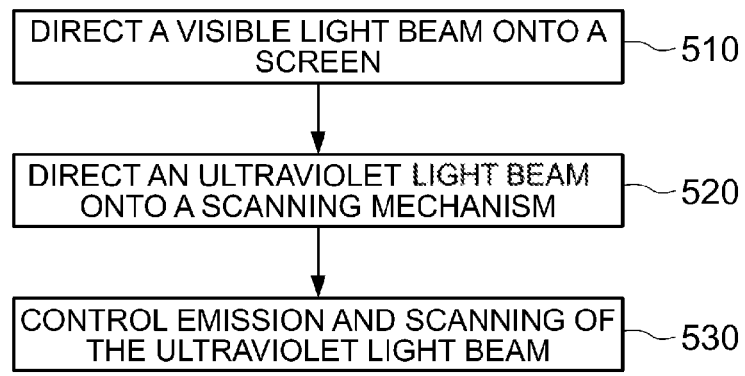
FIG. 5 is a flowchart showing a method of reproducing a holographic image by a holographic image display system arranged in accordance with the present disclosure.

FIG. 5 is a flowchart showing a method of reproducing a holographic image by a holographic image display system arranged in accordance with the present disclosure. The method may be performed under the control of the controller device 150 of the holographic image display system 100.

Referring to FIG. 5, in an operation 510, the first light source 120 may be driven and direct the visible coherent light beam V onto the screen 110. As one non-limiting example, a centre wavelength of the visible coherent light beam V may be about 630 nm. In synchronization with the application of the visible coherent light beam V, in an operation 520, the second light source 130 may be driven and direct the ultraviolet light beam UV onto the scanning mechanism 140 in order to allow the scanning mechanism 140 to scan across the screen 110. As another non-limiting example, the second light source 130 may be driven first, with the first light source 120 then being driven. In an operation 530, the controller 150 may control emissions and scanning of the ultraviolet light beam UV based on a holographic signal so that interference fringes can be formed on the screen 110.

More specifically, the controller 150 may receive the holographic signal through, for example, a transmission system. The controller 150 may generate a synchronization signal and then provide the holographic signal together with the synchronization signal to the second light source 130, while providing the synchronization signal to the scanning mechanism 140. Namely, the second light source 130 may emit the ultraviolet light beam UV in pulses in accordance with the holographic signal and the synchronization signal. In the meantime, the scanning mechanism 140 may conduct scanning in accordance with the synchronization signal so that the ultraviolet light beam UV can be scanned across the screen 110 in a raster scanning manner. As a result of this, the light absorption coefficient of portions of the photochromic layer 112 of the screen 110 where the ultraviolet light beam UV is illuminated may increase, and the portions of the photochromic layer 112 may highly absorb the visible light beam V, so that interference fringes may be formed on the screen 110 in real-time. Thus, the visible coherent light beam V emitted from the first light source 120 may be diffracted due to the interference fringes on the screen, and accordingly a real-time hologram image can be seen via the screen 110.

Figure 6:
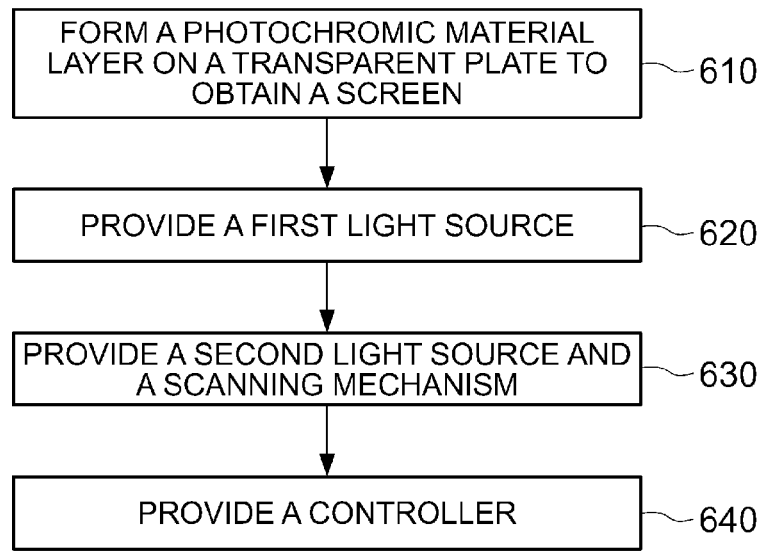
FIG. 6 is a flowchart showing a method of manufacturing a holographic image display system arranged in accordance with the present disclosure.

FIG. 6 is a flowchart showing a method of manufacturing a holographic image display system arranged in accordance with the present disclosure.

Referring to FIG. 6, in an operation 610, a photochromic layer 112 may be formed on a plate 111, and thereby a screen 110 may be obtained. As one non-limiting example, the photochromic layer 112 may be formed by a sputtering process. An apparatus and method for forming a photochromic layer will be discussed later with reference to FIGS. 7 and 8. The obtained screen 110 may be arranged in a predetermined position. In one non-limiting example, the screen 110 may be arranged at a front face of a housing (not shown) so that the surface of the screen 110 on which the photochromic layer is arranged faces the inside of the housing. In an operation 620, a first light source 120 is provided and arranged in the housing so as to direct a visible coherent light beam V onto the surface of the screen 110 facing the inside of the housing. As one non-limiting example, one or more optical elements 160 may be arranged in the path of the visible coherent light beam V. In an operation 630, a second light source 130 and a scanning mechanism 140 are also provided and arranged inside the housing so as to direct an ultraviolet light beam UV onto the surface of the screen 110 facing the inside of the housing. An optical axis of the ultraviolet light beam UV may be set at a predetermined angle with an optical axis of the visible light beam. In an operation 640, a controller 150 may be provided to be in operative connection with the first light source 120, the second light source 130, and the scanning mechanism 140. It is noted that the holographic image display system 100 arranged in accordance with the present disclosure does not use a conventional electron gun. Thus, the holographic image display system 100 allows for a lack of a vacuum system, and accordingly the configuration thereof may become simple.

Figure 7:
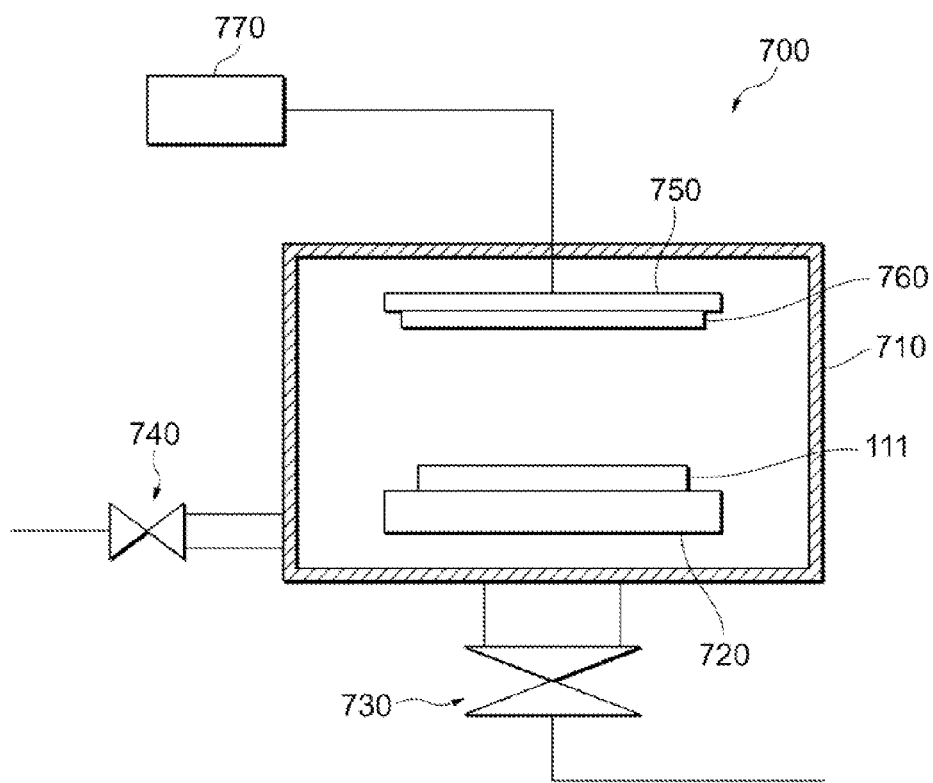
FIG. 7 is a schematic view showing a manufacturing apparatus for forming a photochromic layer on a screen used in a holographic image display system arranged in accordance with the present disclosure.

FIG. 7 is a schematic view showing a manufacturing apparatus for forming a photochromic layer on a screen used in a holographic image display system arranged in accordance with the present disclosure.

As shown in FIG. 7, the manufacturing apparatus 700 may include a chamber 710, a holder 720, an evacuation system 730, and a process gas supplier 740. Further, the manufacturing apparatus 700 may include cathodes 750 having targets 760, and a power source 770. The manufacturing apparatus 700 may be controlled by a host controller (not shown).

The holder 720 may be arranged in the chamber 710 and configured to hold the plate 111 thereon. The holder 720 may be configured to include a heater to heat the plate 111 to a predetermined temperature. The evacuation system 730 may be in gas connection with the chamber 710 and configured to evacuate the chamber 710. The process gas supplier 740 may also be in gas connection with the chamber and configured to supply a mixed process gas to the chamber. As one non-limiting example, the mixed process gas may include an inert gas such as Ar, and an oxygen gas (O2).

The cathodes 750 may each, respectively, include different targets 760. As one non-limiting example, the first cathode 750a may include a potassium tantalate target 760a and the second cathode 750b may include a nickel target 760b. The power source 770 may be operatively connected with each of the cathodes 750 and configured to provide high-frequency power to the cathodes 750. The power source 770 may provide different power wattage to each of the cathodes 750.

Figure 8:
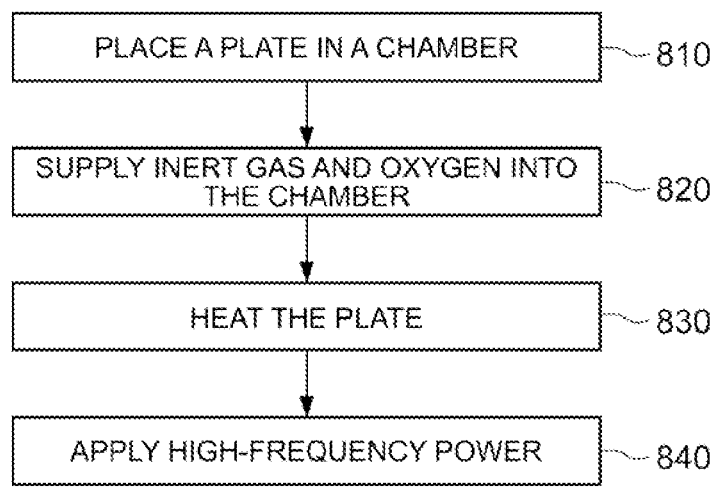
FIG. 8 is a flowchart showing a method of forming a photochromic layer by a manufacturing apparatus discussed with reference to FIG. 7.

FIG. 8 is a flowchart showing a method of forming a photochromic layer by a manufacturing apparatus discussed with reference to FIG. 7. The method may be performed under the control of a host controller.

Referring to FIG. 8, in an operation 810, the plate 111 may be placed on the holder 720 in the chamber 710. Further, two types of targets 760 may be set for the cathodes 750. As one non-limiting example, a first type of target 760a may be made of potassium tantalate, whereas a second type of target 760b may be made of nickel. After that, in an operation 820, the host controller may control the evacuation system 730 so as to evacuate the chamber 710. In an operation 830, the host controller may control the process gas supplier 740 so as to supply a mixed process gas such as an argon-oxygen gas to the chamber 710. As another example, an argon gas and an oxygen gas may be supplied to the chamber 710 separately, and then mixed in the chamber 710. The process gas may be supplied to the chamber 710 until a predetermined pressure is created in the chamber 710. In an operation 840, the host controller may heat the plate 111 at a predetermined temperature. In an operation 840, the host controller may control the power source 770 to apply high-frequency power to the cathodes 750 for a predetermined period of time. By this, sputtering may be performed. After stopping operation of the power source 770, the plate 111 may be cooled down while an argon gas may be being supplied to the chamber 710, and thereafter removed from the holder 720. By way of this process, an Ni-doped KTaO3 layer arranged on the plate 111 may be obtained.

Figure 9:
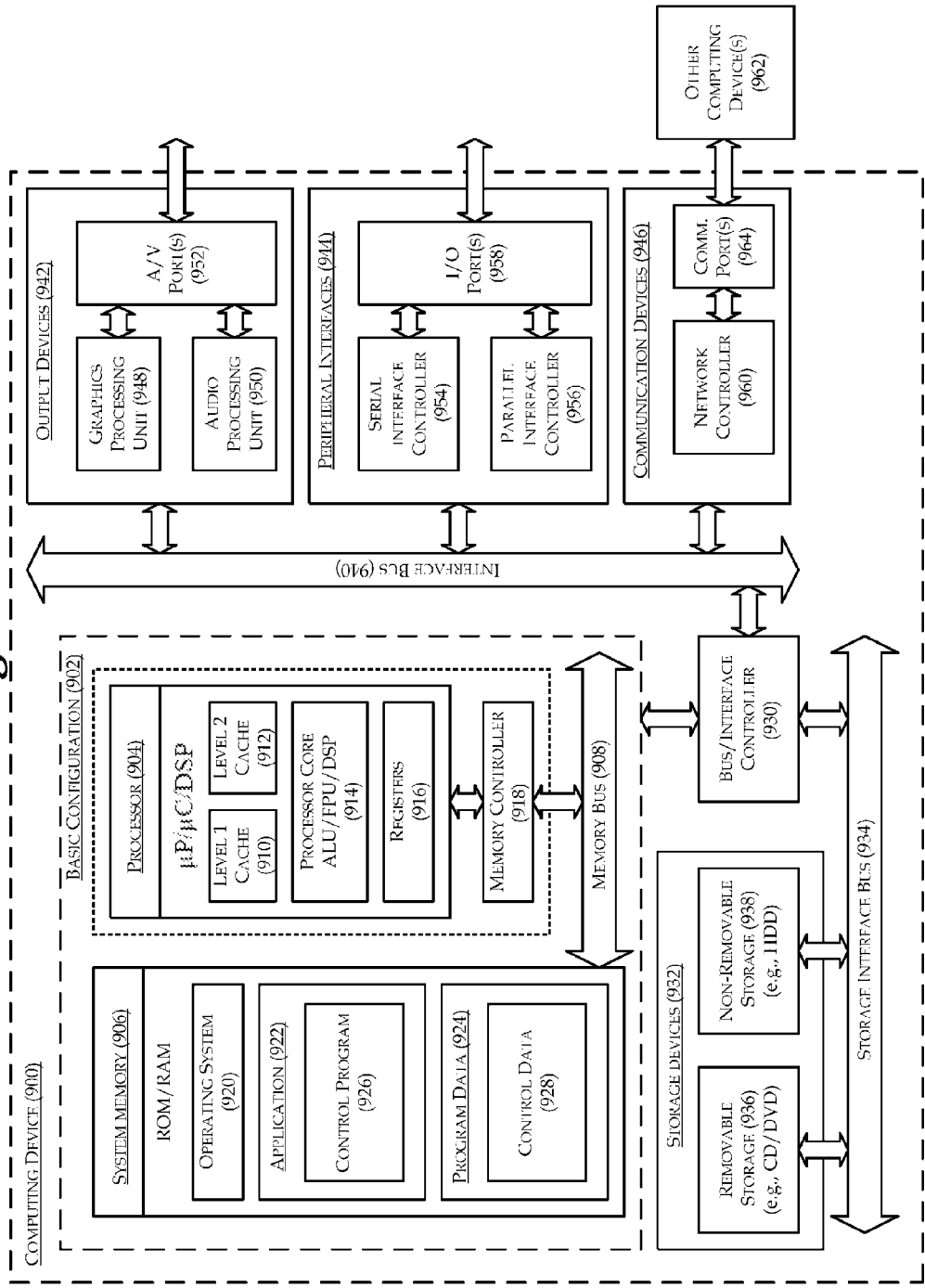
FIG. 9 is a block diagram illustrating an example computing device 900 that is arranged for a holographic image display system in accordance with the present disclosure.

FIG. 9 is a block diagram illustrating an example computing device 900 that is arranged for a holographic image display system in accordance with the present disclosure. In a very basic configuration 902, computing device 900 typically includes one or more processors 904 and a system memory 906. A memory bus 908 may be used for communicating between processor 904 and system memory 906.

Depending on the desired configuration, processor 904 may be of any type including but not limited to a microprocessor, a microcontroller, a digital signal processor (DSP), or any combination thereof. Processor 904 may include one more levels of caching, such as a level one cache 910 and a level two cache 912, a processor core 914, and registers 916. An example processor core 914 may include an arithmetic logic unit (ALU), a floating point unit (FPU), a digital signal processing core (DSP Core), or any combination thereof. An example memory controller 918 may also be used with processor 904, or in some implementations memory controller 918 may be an internal part of processor 904.

Depending on the desired configuration, system memory 906 may be of any type including but not limited to volatile memory (such as RAM), non-volatile memory (such as ROM, flash memory, etc.) or any combination thereof. System memory 906 may include an operating system 920, one or more applications 922, and program data 924. Application 922 may include a control program 926 that is arranged to control the first light source 120, the second light source 130 and the scanning mechanism 140. Program data 924 may include system profiles 928 that may be useful for selecting a scanning rate of the scanning mechanism 140 as is described herein. In some embodiments, application 922 may be arranged to operate with program data 924 on operating system 920 such that the raster scanning can be conducted at the selected rate. This described basic configuration 902 is illustrated in FIG. 9 by those components within the inner dashed line.

Computing device 900 may have additional features or functionality, and additional interfaces to facilitate communications between basic configuration 902 and any required devices and interfaces. For example, a bus/interface controller 930 may be used to facilitate communications between basic configuration 902 and one or more data storage devices 932 via a storage interface bus 934. Data storage devices 932 may be removable storage, devices 936, non-removable storage devices 938, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 906, removable storage devices 936 and non-removable storage devices 938 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of computing device 900.

Computing device 900 may also include an interface bus 940 for facilitating communication from various interface devices (e.g., output devices 942, peripheral interfaces 944, and communication devices 946) to basic configuration 902 via bus/interface controller 930. Example output devices 942 include a graphics processing unit 948 and an audio processing unit 950, which may be configured to communicate to various external devices such as a display or speakers via one or more A/V ports 952. Example peripheral interfaces 944 include a serial interface controller 954 or a parallel interface controller 956, which may be configured to communicate with external devices such as input devices (e.g., keyboard, mouse, pen, voice input device, touch input device, etc.) or other peripheral devices (e.g., printer, scanner, etc.) via one or more I/O ports 958. An example communication device 946 includes a network controller 960, which may be arranged to facilitate communications with one or more other computing devices 962 over a network communication link via one or more communication ports 964.

The network communication link may be one example of a communication media. Communication media may typically be embodied by computer readable instructions, data structures, program modules, or other data in a modulated data signal, such as a carrier wave or other transport mechanism, and may include any information, delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

The holographic image display system 100 arranged in accordance with the present disclosure may be used as, for example, a three-dimensional television. Specifically, the holographic image display system 100 may be configured to include a receiver to receive a holographic signal transmitted from, for example, a broadcasting station or base station. The holographic signal may be a signal corresponding to a holographic motion image of an original object or scene. The holographic image display system 100 may display the holographic motion image on the screen 110 in real time once the receiver receives the holographic signal.

Figure 10:
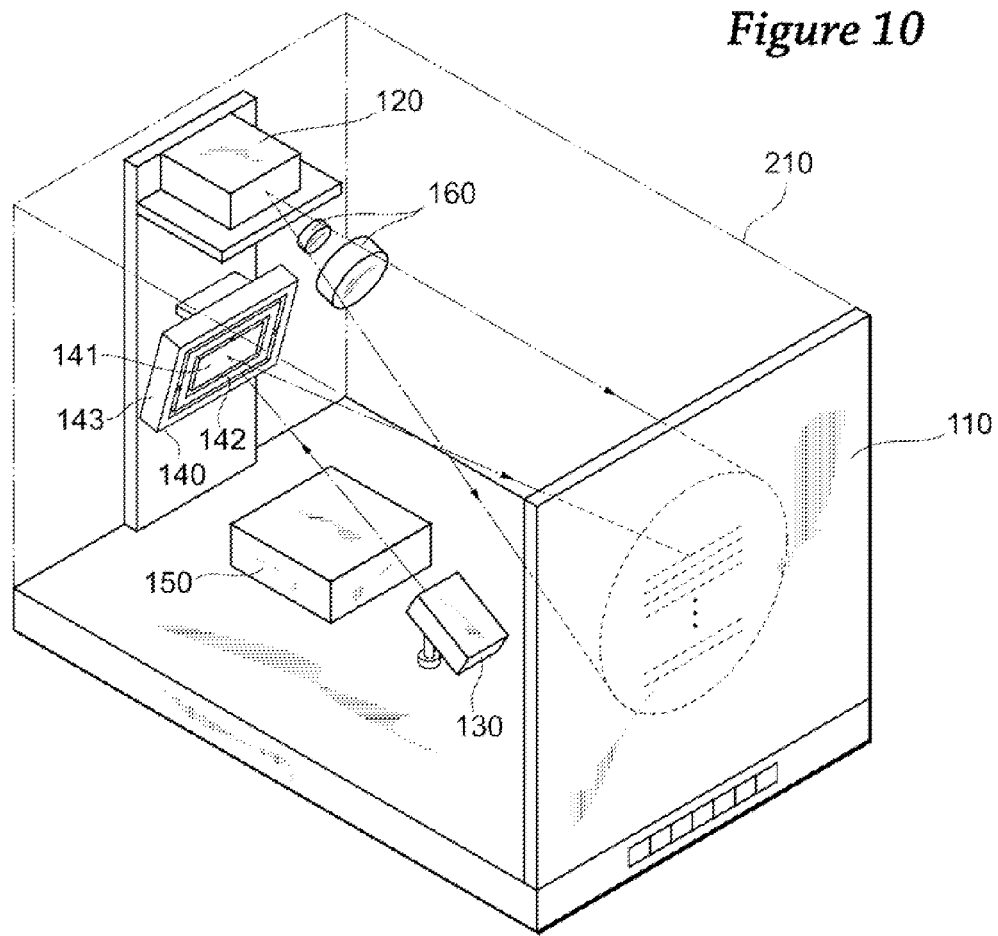
FIG. 10 is a schematic perspective view showing an example of a three-dimensional television using a holographic image technique arranged in accordance with the present disclosure.

FIG. 10 is a schematic perspective view showing a non-limiting example of a three-dimensional (3D) television using a holographic image technique arranged in accordance with the present disclosure. As shown in FIG. 10, the 3D television 200 may include a housing 210 substantially defining the exterior thereof. The housing 210 may be made of, but is not limited to being made of, a resin material such as polycarbonate, or acrylonitrile butadiene styrene (ABS). A screen 110 may be arranged at a front surface of the housing 210 so that a photochromic layer 112 arranged on the screen 110 faces the inside of the housing 210. At the opposite side of the screen 110 inside the housing 210, a first light source 120 may be arranged so as to be directed to the screen 110. In this example, optical elements 160 may be arranged on a path of light emitted from the first light source 120. Further, a scanning mechanism 140 may be arranged so as to reflect an ultraviolet light beam emitted from a second light source 130 and direct the reflected beam to the screen 110. In this non-limiting example, the scanning mechanism 140 may include a mirror 141 which can be rotatable in two directions. That is, the mirror 141 may be in connection with an inner frame 142 through a first shaft extending in a first axis (e.g., a Y-axis) and the inner frame 142 may be in connection with a casing 143 through a second shaft extending in a second axis (e.g., an X-axis). Further, a controller 150 may be arranged on a bottom plate of the housing 210.

Figure 11:
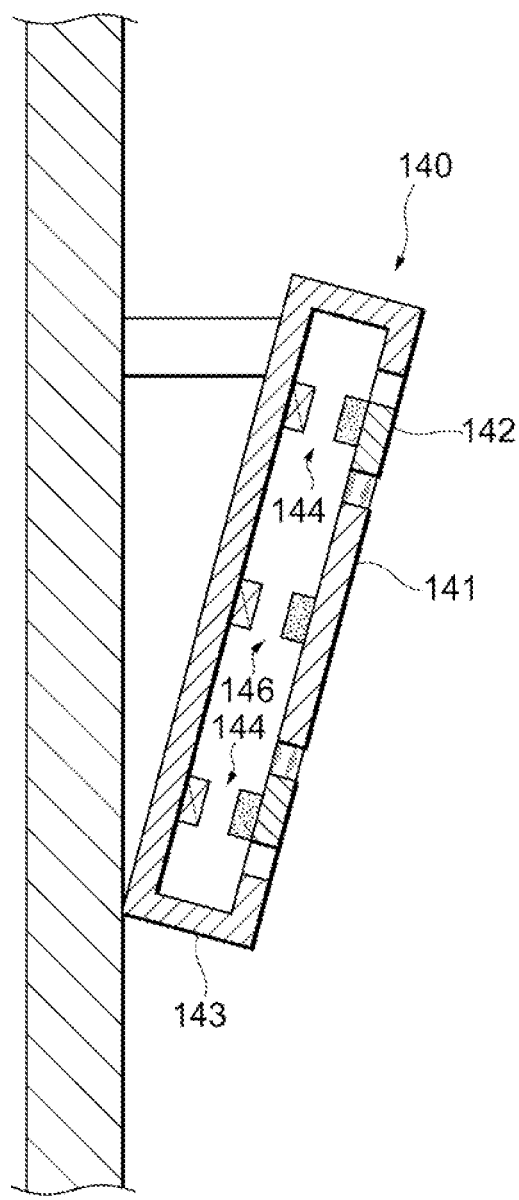
FIG. 11 is a partial, cross-sectional view showing a scanning mechanism of a holographic image display system 100 arranged in accordance with the present disclosure.

FIG. 11 is a partial, cross-sectional view showing a scanning mechanism of a holographic image display system 100 arranged in accordance with the present disclosure. As discussed above, the scanning mechanism 140 may include the mirror 141, the inner frame 142, and the casing 143. Further, the scanning mechanism 140 may include driving units 144 and 146. Each of the driving units 144 and 146 may be composed of a set of a permanent magnet and an electromagnet. By way of this configuration, the mirror 141 can be rotated around the first shaft in a rolling direction and also the inner frame 142 can be rotated around the second shaft in a pitching direction, thereby allowing the mirror 141 to be rotated in two directions.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

While the technology has been described with respect to a limited number of embodiments, those skilled in the art, having the benefit of this disclosure, will appreciate that other embodiments can be devised which do not depart from the scope of the technology as disclosed herein. Accordingly, the scope of the technology should be limited only by the attached claims.

The invention claimed is:

1. A holographic image display system comprising:
   a screen including a photochromic material having a band gap greater than about 3 eV, the photochromic material having an initial value of light absorption coefficient when not illuminated by ultraviolet light, wherein the photochromic material is transmissive to visible light when the light absorption coefficient has the initial value, and wherein the light absorption coefficient increases when the photochromic material is illuminated by ultraviolet light and reverts to the initial value when the illumination by the ultraviolet light is removed;
   a first light source configured to emit a visible coherent light beam that is applied to the screen;
   a second light source configured to emit an ultraviolet light beam that is applied to the screen;
   a scanning mechanism configured to allow the ultraviolet light beam to scan across the screen; and
   a controller configured to control emissions of the second light source and scanning of the scanning mechanism based on a holographic signal.

2. The holographic image display system of claim 1, wherein the screen includes a transparent plate having a surface on which the photochromic material is arranged.

3. The holographic image display system of claim 1, wherein the photochromic material comprises at least one of $KTaO_3$, $SrTiO_3$, and $BaTiO_3$, doped with at least one of Fe, Ni, Co, Cr, and V.

4. The holographic image display system of claim 1, wherein the photochromic material is $KTaO_3$ doped with Ni.

5. The holographic image display system of claim 1, wherein the photochromic material is made of an organic photochromic material.

6. The holographic image display system of claim 5, wherein the organic photochromic material comprises hexaarylbiimidazole (HABI).

7. The holographic image display system of claim 1, wherein a thickness of the photochromic material is between 1 micrometer and 10 micrometers.

8. The holographic image display system of claim 1, further comprising a hologram generator configured to generate the holographic signal using the visible coherent light beam.

9. The holographic image display system of claim 1, wherein the first light source is a laser.

10. The holographic image display system of claim 1, wherein the first light source is any one of a He-Ne laser, an Ar laser, an AlGaInP-based laser, and a GaN-based laser.

11. The holographic image display system of claim 1, wherein the second light source is a laser.

12. The holographic image display system of claim 1, wherein the second light source is a He-Cd-based laser.

13. The holographic image display system of claim 1, wherein the scanning mechanism is configured to allow the ultraviolet light beam to scan at a rate that is selected by a diameter of the ultraviolet light beam and a time for changing to a predetermined optical transmissivity of the photochromic material.

14. The holographic image display system of claim 1, wherein the screen is formed of glass.

15. A method of reproducing a holographic image, the method comprising:
   directing a visible coherent light beam onto a screen, the screen including a photochromic material having a band gap greater than about 3 eV, the photochromic material having an initial value of light absorption coefficient when not illuminated by ultraviolet light, wherein the photochromic material is transmissive to visible light when the light absorption coefficient has the initial value, and wherein the light absorption coefficient increases when the photochromic material is illuminated by ultraviolet light and reverts to the initial value when the illumination by the ultraviolet light is removed; and
   directing an ultraviolet light beam onto the screen, while controlling emissions of the ultraviolet light beam and controlling scanning of the ultraviolet light beam across the screen, based on a holographic signal.

16. The method of claim 15, wherein directing the visible coherent light beam onto the screen including the photochromic material further comprises directing the visible coherent light beam onto the screen including at least one of $KTaO_3$, $SrTiO_3$, and $BaTiO_3$, doped with at least one of Fe, Ni, Co, Cr, and V.

17. The method of claim 15, wherein directing the visible coherent light beam onto the screen including the photochromic material comprises directing the visible coherent light beam onto the screen including $KTaO_3$ doped with Ni.

18. The method of claim 15, wherein the screen is formed of glass.

19. The method of claim 15, wherein the holographic image is a stereoscopic image.

20. A method of manufacturing a holographic image display system, the method comprising:
- forming a photochromic layer on a surface of a transparent plate so as to obtain a screen, the photochromic layer having a band gap greater than about 3 eV and comprising a photochromic material having an initial value of light absorption coefficient when not illuminated by ultraviolet light, wherein the photochromic material is transmissive to visible light when the light absorption coefficient has the initial value, and wherein the light absorption coefficient increases when the photochromic material is illuminated by ultraviolet light and reverts to the initial value when the illumination by the ultraviolet light is removed;
- providing a first light source configured to emit a visible coherent light beam so as to direct the visible coherent light beam onto the screen;
- providing a scanning mechanism on a light path of an ultraviolet light beam so as to allow the ultraviolet light beam to scan across the screen; and
- providing a controller configured to control emissions of the second light source and scanning of the scanning mechanism, based on a holographic signal.

21. The method of claim 20, wherein the forming of the photochromic layer comprises depositing the photochromic layer via a sputtering process.

22. The method of claim 20, wherein depositing the photochromic layer via the sputtering process includes sputtering a target comprised of at least one of $KTaO_3$, $SrTiO_3$, and $BaTiO_3$ and a target comprised of at least one of Fe, Ni, Co, Cr, and V in the presence of a reactive gas.

* * * * *

UNITED STATES PATENT AND TRADEMARK OFFICE
CERTIFICATE OF CORRECTION

PATENT NO. : 9,019,584 B2  
APPLICATION NO. : 13/577508  
DATED : April 28, 2015  
INVENTOR(S) : Yamaichi Page 1 of 1

It is certified that error appears in the above-identified patent and that said Letters Patent is hereby corrected as shown below:

Specification

Column 1, Lines 6-7, delete "35 U.S.C. §371" and insert -- 35 U.S.C. § 371 --, therefor.

Column 5, Line 61, delete "other," and insert -- others, --, therefor.

Column 10, Line 22, delete "information, delivery" and insert -- information delivery --, therefor.

Signed and Sealed this
Twenty-ninth Day of September, 2015

Michelle K. Lee
*Director of the United States Patent and Trademark Office*